United States Patent [19]

Manos

[11] Patent Number: 5,672,212
[45] Date of Patent: Sep. 30, 1997

[54] ROTATIONAL MEGASONIC CLEANER/ETCHER FOR WAFERS

[75] Inventor: James T. Manos, Plano, Tex.

[73] Assignee: Texas Instruments Incorporated, Dallas, Tex.

[21] Appl. No.: 755,690

[22] Filed: Nov. 25, 1996

Related U.S. Application Data

[63] Continuation of Ser. No. 269,717, Jul. 1, 1994, abandoned.

[51] Int. Cl.[6] .................................. B08B 3/08; B08B 3/12
[52] U.S. Cl. .......................... 134/1.3; 134/33; 134/158; 134/159; 134/902; 437/9; 437/225; 437/946
[58] Field of Search .................................. 134/1, 1.3, 33, 134/158, 159, 160, 902; 437/946, 9, 10, 225

[56] References Cited

U.S. PATENT DOCUMENTS

| | | | |
|---|---|---|---|
| 4,325,394 | 4/1982 | Reams | 134/141 |
| 4,750,505 | 6/1988 | Inuta et al. | 134/153 |
| 4,850,381 | 7/1989 | Moe et al. | 134/62 |
| 4,980,300 | 12/1990 | Miyashita et al. | 437/10 |
| 5,464,480 | 11/1995 | Matthews | 134/1.3 |

*Primary Examiner*—Donald E. Czaja
*Assistant Examiner*—Sean Vincent
*Attorney, Agent, or Firm*—W. Daniel Swayze, Jr.; W. James Brady, III; Richard L. Donaldson

[57] ABSTRACT

A method and apparatus for a wafer processing apparatus using a rotation mechanism. Wafers 13 are placed into a carrier 1 which has a central axis. The carrier 1 and wafers 13 are placed into a megasonic tank 15 with a megasonic transducer 23. A rotational driving system 25 is used to rotate the wafer carrier 1 and the wafers 13 about the central axis while the wafers are in the tank 1. Other embodiments are provided.

11 Claims, 3 Drawing Sheets

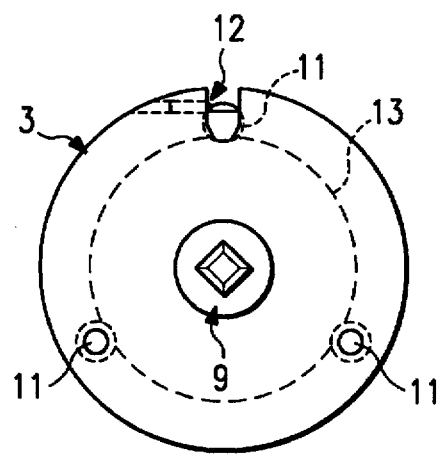
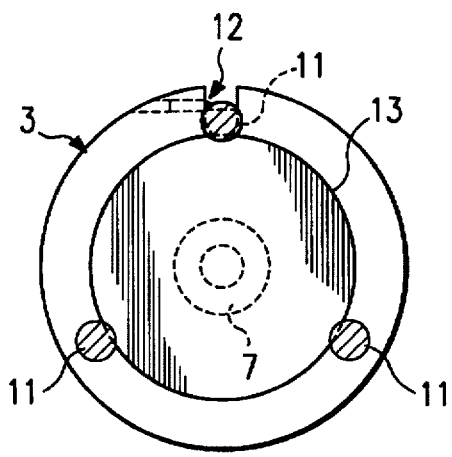
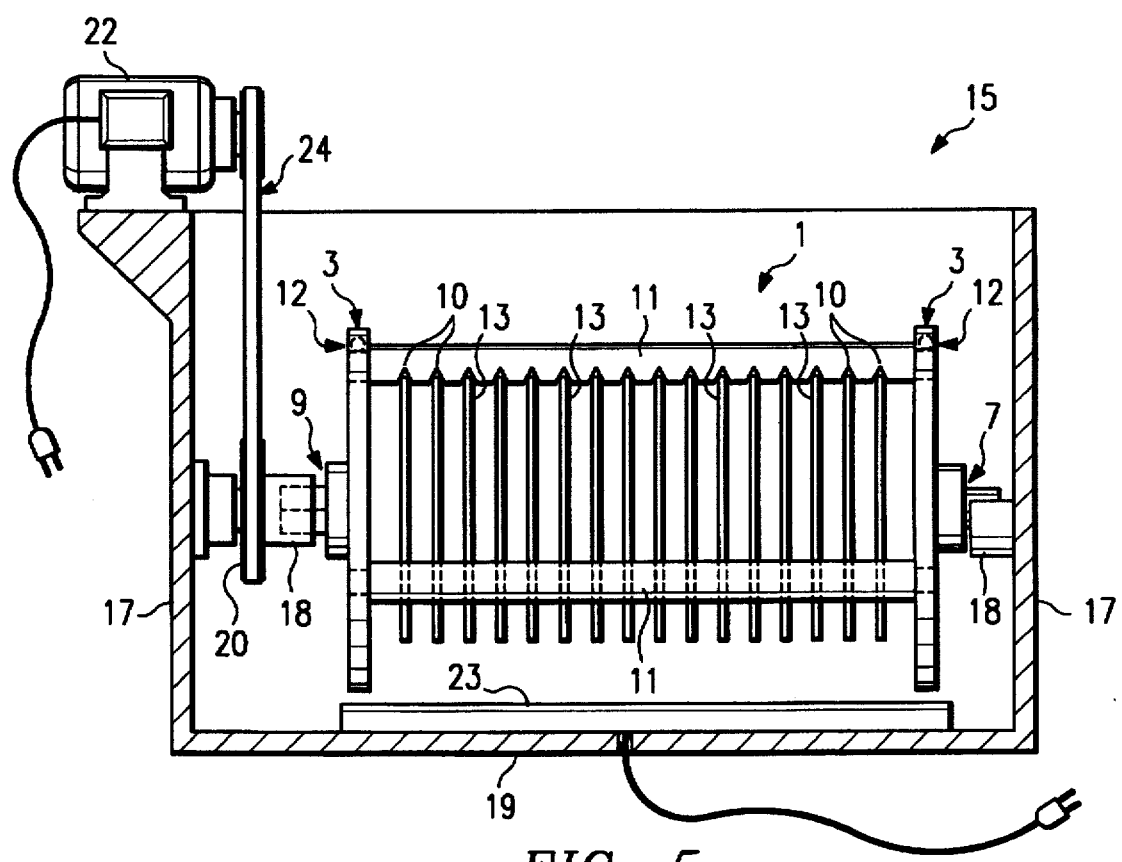

ROTATIONAL MEGASONIC CLEANER/ETCHER FOR WAFERS

This application is a Continuation, of application Ser. No. 08/269,717 filed on Jul. 1, 1994 now abandoned.

FIELD OF THE INVENTION

This invention generally relates to a method and apparatus for an improved wafer cleaner for use in fabricating wafers such as the semiconductor wafers used for integrated circuits and electronic devices.

BACKGROUND OF THE INVENTION

Without limiting the scope of the invention, the background is described in relation to wafer cleaning process steps in an integrated circuit production facility. Semiconductor devices are typically fabricated on a semiconductor substrate that takes the form of a wafer. The circuitry for the electronic devices is fabricated on a wafer of semiconductor material using photolithography and vapor phase deposition techniques, also selective etching techniques. Many electronic devices are produced on a single wafer. After the individual devices are completely fabricated, the wafer is cut into the individual die.

The wafers used in the fabrication of semiconductor devices are typically circular and quite thin. One problem which arises in producing circuitry on the circular wafers is that particulate matter which accumulates on the outer edge and the outer circumference of the wafer, in areas where no circuitry is defined, migrates into the areas where circuitry is being defined. Particles left on wafers will be redistributed during wafer processing and will move onto active die in the area of the wafer that is used for production. These particles cause defects in the circuitry being defined on the wafer. As device geometries continue to shrink, these particles will become larger compared with the device geometries and the defects will correspondingly be more critical. These defects result in non-functional electronic devices, which reduce the unit yield per wafer and correspondingly increase the cost of production per unit.

Known cleaning systems that address the particulate matter on the outer edge and outer circumference of the wafers use a cleaning solution in a tank coupled with a megasonic traducer. The wafers are placed in the tank of cleaning chemicals and the tank is excited by energy radiating from the megasonic transducer which increases the rate of reaction. Because the wafers are placed in the tank in a vertical orientation, some parts of the wafer are farther away from the megasonic energy source than others, typically the transducer is located at the bottom of the tank and the energy radiates from it. This results in a nonuniform cleaning rate. As wafers increase in size to accommodate larger circuits and increasing integration, these effects will increase in significance. Known cleaning systems correct for this nonuniform effect by using more etch time than required at the areas closer to the transducer to extend the proper etching or cleaning results to those areas farther away. In spite of this, the wafers are cleaned or etched in a nonuniform manner.

Some known systems move wafers about in the tanks during cleaning but none address the problem associated with non uniform exposure to the megasonic energy source. The non-uniform results are detectable with current technology wafers of 4 inches, and will be more pronounced as the industry moves toward an 8 inch wafer as the standard.

The invention of this application addresses the nonuniform cleaning rates and the extended processing time for obtaining acceptable results with the prior art megasonic cleaning and etching systems.

SUMMARY OF THE INVENTION

Generally, and in one form of the invention, an improved megasonic cleaner/etcher is described which features a wafer rotation system. Wafers are loaded into a carrier designed to support the wafer with a minimum physical contact area, and the carrier is deposited into a megasonic cleaning tank. While the megasonic transducer is active, the carrier and the wafers are rotated rapidly about their central axis. This ensures that all areas of the wafers are uniformly exposed to the megasonic energy and thus experience a uniform cleaning or etching rate.

Further embodiments implement a megasonic tank with an automatic emptying feature, so that after the clean or etch stop the rotating carrier can be used in an empty tank to effectuate a rinsing and spin drying operation. This embodiment allows two or three pieces of prior art equipment to be replaced with the preferred embodiment of the megasonic cleaner of the invention.

BRIEF DESCRIPTION OF THE DRAWINGS

In the drawings:

FIG. 3 depicts a third view of the wafer carrier of the invention;

FIG. 4 depicts a fourth view of the wafer carrier of the megasonic cleaner of the invention;

FIG. 5 depicts a first view of the megasonic cleaning tank containing the wafer carrier of the invention;

DETAILED DESCRIPTION OF PREFERRED EMBODIMENT

A first preferred embodiment megasonic cleaning device includes a wafer carrier and a megasonic tank. This megasonic system can be used to clean wafers and for etching steps used in fabricating semiconductor devices. Typical etching steps where the preferred embodiment can be used include cleaning, local interconnect wet etch processing, and excess Ti/TiN strip after $TiSi_2$ silicide formation. During the cleaning or etching step, the wafer carrier is rotated. This rotation enhances the efficiency and uniformity of the etching or cleaning action because all of the areas of the wafers are exposed to the energy from the megasonic transducer within the megasonic cleaning tank in a uniform manner, so that a uniform clean or etch rate occurs.

A second preferred embodiment megasonic cleaner and carrier includes a megasonic cleaning tank which has a bottom that automatically operates. This provides the capability to automatically empty the tank. The tank includes spray nozzles that operate to fill the tank before or during the etching or cleaning steps. The nozzles are also available to rinse the wafers while the carrier is rotated. This eliminates the need for a second machine to perform the rinsing operation, as is done in the prior art. Also, after the rinsing operation is completed the carrier can continue to rotate to provide a spin drying operation, further enhancing the efficient production of wafers by incorporating a third step into a single machine.

Figure 1:
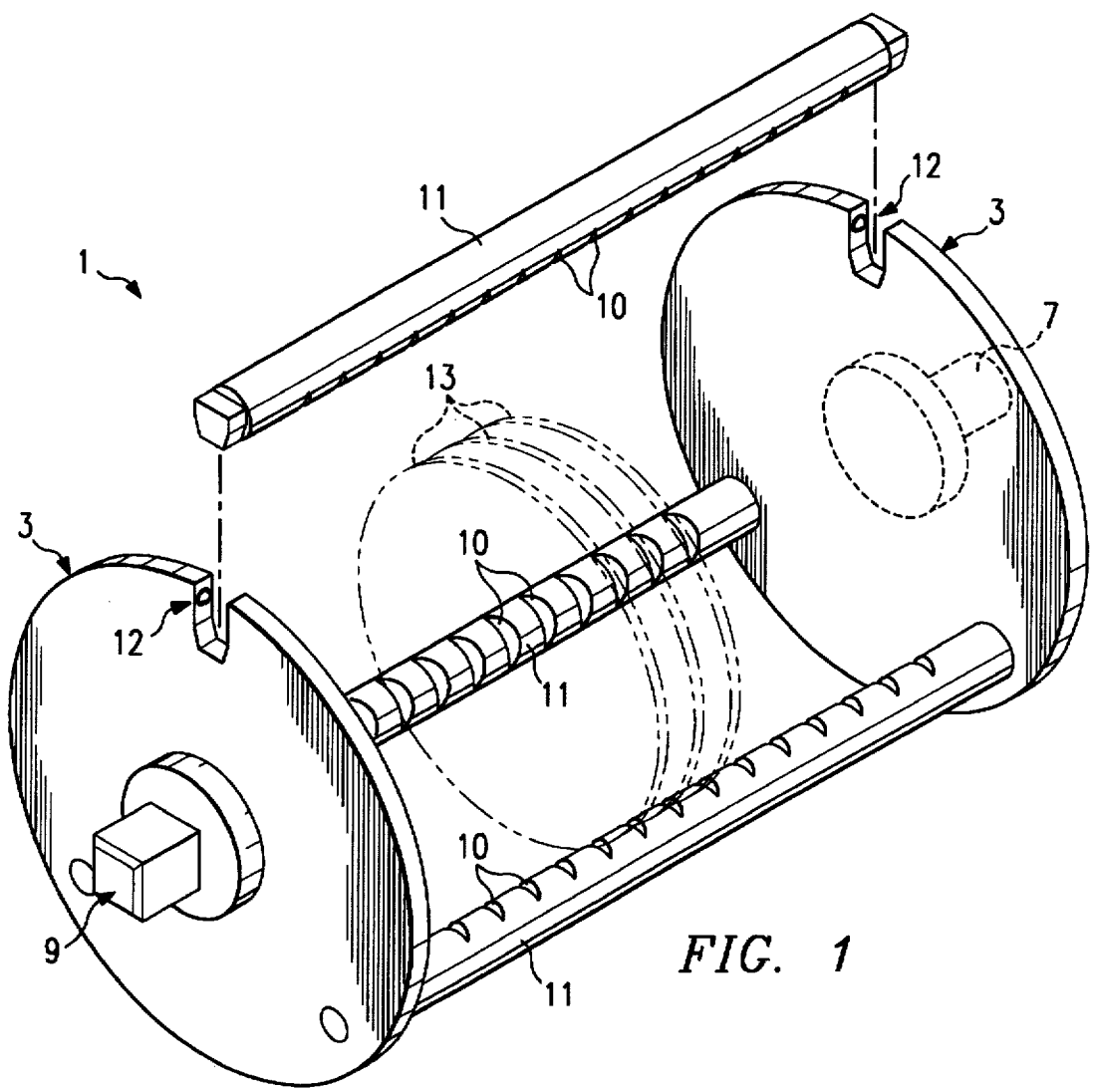
FIG. 1 depicts a first view of the wafer carrier of the invention.

FIG. 1 depicts a first embodiment of the wafer carrier 1 of the invention. Ends 3 are circular pieces which have holes or sockets for receiving supports 11. Ends 3 could be other shapes as well, but circular is perhaps most convenient. Supports 11 have grooves or spacers 10 attached to support the edges of the wafers and to maintain a uniform spacing of the wafers. Pegs 7 and 9 are connected to and extend from the center of the outside faces of ends 3, to provide a central axis about which carrier 1 can rotate. Peg 9 is machined to fit into a driving mechanism. At least one of the rods 11 is removable, so that the wafers 13 can be loaded and unloaded into carrier 1. Clamps or latches 12 are shown as one means to provide an attachment for one of the rods 11 so that it can be removed and reattached. The clamps 12 mate to the ends of the removable rod 11 so that it can only be oriented in one direction, to ensure the grooves are properly positioned.

Figure 2:
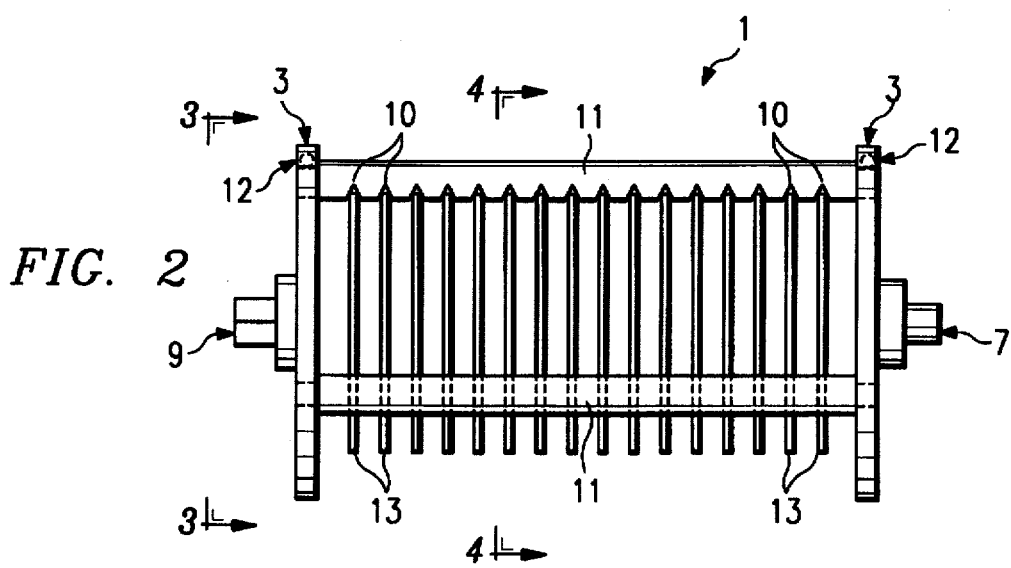
FIG. 2 depicts a second view of the wafer carrier of the invention.

FIG. 2 depicts a second view of the wafer carrier of the preferred embodiment. The wafer carrier 1 is a cylindrical shaped member having a length shorter than the megasonic tank, and having two circular ends 3. Each circular end has a protruding axle member at its center on the outside surface, pegs 7 and 9. Rods or spokes 11 run the length of the cylinder to provide support for wafers to be loaded into the carrier and are coupled to ends 3 on their outer edges. Each rod has equally spaced grooves 10 to hold the edges of the wafers and to maintain a uniform spacing of the wafers. One or more of the rods 11 has at least one clamp 12 to enable the rod to be removed or opened for wafer loading and unloading operations, the clamp 12 then securing the rod and thus also securing wafers 13. Clamps could be provided at both ends of the rod, as shown, or at one end. The wafer carrier 1 can be removable from the megasonic tank and could be designed to accommodate an automatic wafer handling system, or alternatively and perhaps simpler the wafer carrier could be permanently mounted inside a megasonic tank and wafers loaded and removed with the carrier in the tank.

FIG. 3 depicts a view from one end of the wafer carrier 1, along the line 3—3. Wafer carrier 1 is fabricated from a material that will withstand the particular solutions that are being used in the application without reacting and producing particulate or any unwanted effluent, and without reacting with the wafer material. Generally the carrier should have a low metallic content and preferably be coated with a nonreactive coating such as Teflon. End piece 3 is shown with rods 11 attached, clamp 12 providing a coupling means to one or more of the rods, and peg 7 or 9 protruding from the center of end piece 3. A single wafer 13 is shown located behind end 3 and supported by rods 11. The wafer rests in the grooves in the rods so that it does not become displaced while loaded in the wafer carrier.

The area of the rods 11 which contact the wafer must be kept at the minimum required to provide support, so that the maximum area of the wafer is exposed to the cleaning or etching solution. However, enough support must be provided so that the wafers can be rotated without causing stresses to the wafer. The size of the supports will depend on the speed of the rotation, the size of the wafer being used, and the strength of the particular wafers being used in the system.

FIG. 4 depicts a cross sectional view of the wafer carrier of FIG. 1 along the axis labeled 4—4 in FIG. 1. Now wafers 13 are shown between the viewer and end piece 3. Rods 11 are shown contacting the outer edge of the wafers to provide support and to secure the wafers inside the carrier during the rotation of the wafer carrier.

FIG. 5 shows the a first preferred embodiment of the megasonic cleaning tank 15 to be used with the wafer carrier 1, with wafer carrier 1 loaded into the tank. The tank 15 comprises sides 17, bottom 19, and a megasonic transducer 23. Sides 17 includes supports 18 to receive pegs 7 and 9 on wafer carrier 1 so as to hold the wafer carrier in the middle of tank 15 and allow the wafer carrier 1 to rotate about its central axis. Motor 22 is provided and coupled to wafer carrier 1 which is shown inside the tank 15 by belt 24 and pulley 20. Pulley 20 is arranged to make loading and unloading the carrier possible without disturbing belt 24. Alternative means to rotate the carrier are also possible, for instance belt 24 could be replaced by a chain. Motor 22 could be coupled to the carrier through a direct drive system, by making a throughhole for an axle in the side of tank 15 and coupling the motor directly to carrier 1. Magnetic drive coupling could be used, where motor 25 would turn a large circular magnet, and carrier 1 would have a similar magnet of opposite polarity on one end. The motor 22 and carrier 1 would be coupled by placing the motor and drive magnet adjacent the side of the tank 15 and allowing the two magnets to magnetically couple together.

In operation the wafers 13 are loaded into the carrier 1 and placed into the tank 15. Depending on the operation to be performed on the wafers, water and cleaning solvents, or alternatively etchants, are added to the tank until the wafers and the carrier are submerged. Megasonic transducer 23 is activated and motor 22 is also activated to rotate the wafers and the carriers. In operation the wafers can be rotated while the tank is filling, and before the megasonic source 23 is energized, to provide still more uniform exposure to the cleaner or etchant. Typically wafers are cleaned using deionized water. A typical etchant to be used after the Ti/N deposition is one part $NH_4OH_2$, one part $H_2O_2$ and four parts $H_2O$. Other alternatives include etchants comprising so-called piranha solutions, HF solutions, HCl solutions, and sulfuric acid solutions.

The rotation of the wafer carrier 1 ensures that all of the wafer edges and the outer circumferences are uniformly exposed to the megasonic energy transferred into the bath by transducer 23. After the prescribed time elapses for the particular cleaning or etching operation, the transducer is turned off, and the rotational motor is stopped. The wafer carrier 1 may now be removed and the wafers 13 unloaded for the next operation. Because all areas of the wafers 13 are uniformly exposed to the energy source, the etch or clean time used will be shorter than In systems of the prior art, where the time required to process the tops of the wafers was much longer than that of the bottom, and the total elapsed time had to be long enough to complete processing of the tops of the wafers. Also, in the prior art systems the bottom areas received more etching or cleaning than required in order to compensate for the slower rate in the top areas of the wafers. Further, the system of the invention can use fewer chemicals for processing each carrier full of wafers than prior art systems, because the processing time is lower and rotating the wafers results in a more efficient use of the chemicals in the tank.

An alternative mode of operation for the embodiment of FIG. 5 is to rotate the carrier 1 in a stepwise fashion. For example, the wafers 13 and carrier 1 could be rotated ninety degrees, then exposed to megasonic energy for a prescribed time, then rotated another ninety degrees. This method creates much less turbulence within the tank and may be more compatible with some existing tanks than the continuous rotation described above, also a low power stepping motor can be used instead of a motor required to rotate the carrier for a sustained period of time.

Figure 6:
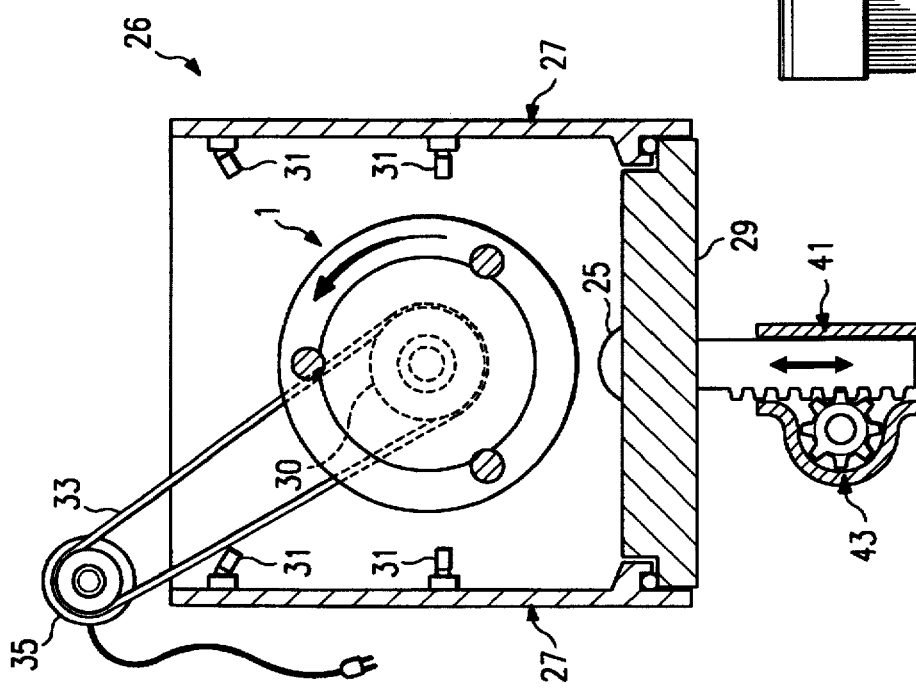
FIG. 6 depicts a second preferred embodiment of the megasonic cleaning tank with the automatic bottom open for a rinsing operation.

FIG. 6 depicts the enhanced megasonic cleaning tank 30 of the second preferred embodiment. Sides 27 comprise a tank which is initially open at the top and has a bottom 29, the sides having seals placed to contact the bottom 29 so that when bottom 29 is raised a watertight seal is formed. Megasonic transducer 25 is affixed to the bottom 29. Spray/nozzles 31 are located around the tank and are affixed to the sides 27. Carrier 1 is removable and rests on brackets 30 in sides 27. Motor 35 is used to rotate carrier 1 by a chain or belt as described with respect to FIG. 4. Bottom 29 travels up and down and this motion is powered by any suitable motor or gearing system, such as the piston 41 which has grooves to receive the teeth of sprocket 43, which is driven by a stepping motor. As the sprocket turns the piston 41 moves up and down in response to the force applied by the sprocket. Many other alternative means could be used to move bottom 29 up and down.

In operation, carrier 1 is loaded with wafers and placed in the tank, as before. Motor 35 is activated and the wafers begin rotating. Water spray/fill nozzles 31 are used to fill the tank, and the appropriate cleaners or etchants are also added. Carrier 1 may be coupled to the motor 35 directly with a sealed direct drive fitting coming through one side of the tank 26, or by a chain or belt drive mechanism from the top of the tank as shown in FIG. 6. Megasonic transducer 25 is activated and the cleaning or etching operation begins.

After a prescribed time has elapsed and the cleaning or etching stop is completed, the bottom 29 is made to travel downwards. As the bottom 29 moves away from sides 27, the tank 26 will empty and carrier 1 and the loaded wafers will be resting in the ambient atmosphere on the brackets 30 in sides 27.

Spray nozzles 31 are now used with the rotational motion of carrier 1 to rinse the wafers. The bottom 29 is again raised to contact the sides 27. Nozzles 31 are used to spray deionized water or another desired rinsing agent into the tank 26 and onto the rotating wafers. As the tank fills the wafers will become submerged as they rotate. Once the tank is filled with the rinsing agent nozzles 31 are deactivated and the rotation can continue for a predetermined time while megasonic transducer 25 is active, then bottom 33 is again moved away from the tank and the tank is emptied. This cycle can be repeated for as many times as desired to achieve a desired particle removal rate. After the rinsing operation is completed, the spray nozzles 31 are inactivated and the wafers are left rotating in the ambient environment.

Figure 7:
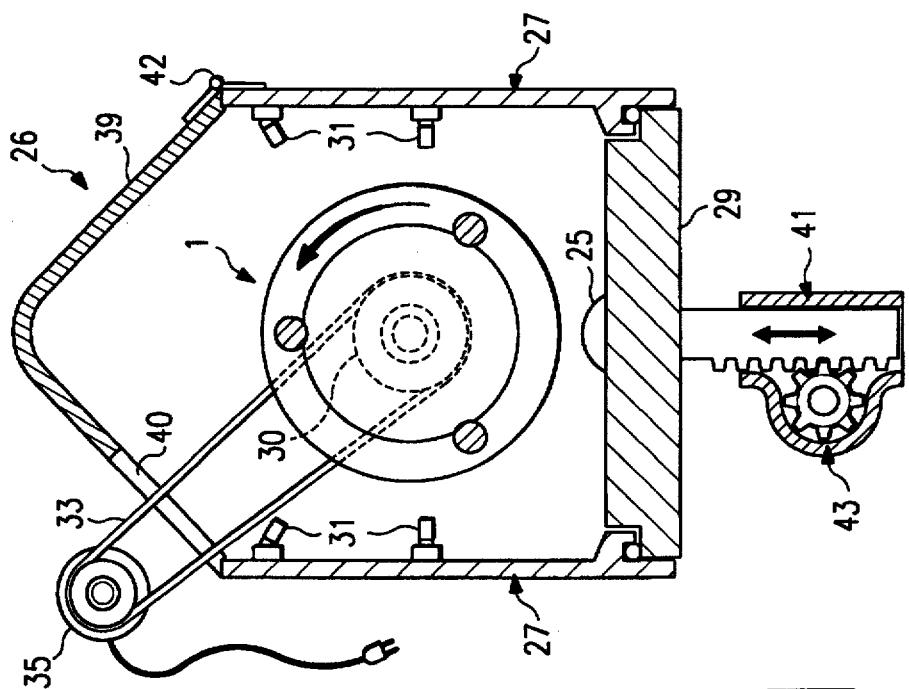
FIG. 7 depicts a third preferred embodiment of the megasonic cleaning tank with a top adapted for a spin drying operation.

FIG. 7 depicts an enhanced version of the tank 26 of FIG. 6 including a top, 39, attached to the tank by a hinge 42. Tank 26, comprising sides 27, bottom 29, nozzles 31, transducer 25, motor 35, belt 33, carrier 1, piston 41 and sprocket 43 are again as shown in FIG. 6.

Figure 8:
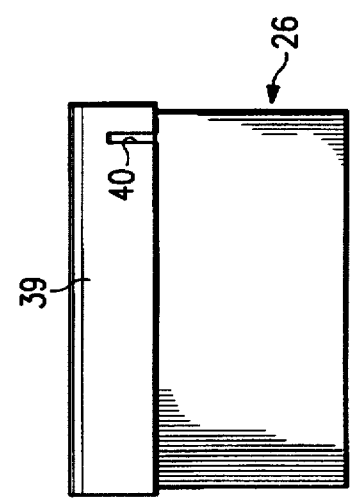
FIG. 8 depicts a second view of the third preferred embodiment of the megasonic cleaning tank of FIG. 7.

FIG. 8 depicts a side view of the tank 26 and top of 39 FIG. 7, and shows a slot 40 adapted to enable belt 33 to pass through the top 39 and into the tank 26.

Prior art systems typically provide a drying operation in a separate machine. If desired, the enhanced tank of FIGS. 7 and 8 can provide the drying operation as well. A top 39 is added to the tank 26 and this top 39 should preferably be shaped so that the center is higher than the sides. This top should be closed once the wafer carrier 1 is loaded into the tank 26. A slot or hole 40 is provided to enable the belt 33 to pass through the hole and couple to the carrier 1 within the tank, this opening should be small and arranged to minimize any liquid escaping through it. By rotating the wafers rapidly while the bottom 29 is away from the sides and the tank can drain, a drying operation can be achieved. The liquid thrown off the wafers is directed to the sides 27 and the bottom, the liquid which hits the top 39 drains off to the sides 27 and thus stays away from the wafers. This operation provides a spin drying action where the liquid remaining on the wafers is rapidly thrown off by the rotational movement of the wafers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An method for processing semiconductor wafers, comprising the steps of:

providing a tank having sides attached to a bottom;

providing a wafer carrier loaded with semiconductor wafers for processing, said wafer carrier having supports for holding a plurality of wafers to be processed, said supports securely holding said semiconductor wafers at the edges of said wafers;

providing support means within said tank for holding said wafer carrier inside said tank so that said wafer carrier can rotate freely about an axis;

providing rotation means coupled to said wafer carrier for causing said wafer carrier to rotate about its axis within said tank while said wafers are securely held within said wafer carrier;

rotating said wafer carrier and said wafers within said tank while processing said wafers, thereby exposing all areas of said wafers equally during said processing;

providing a megasonic transducer within said tank;

directing megasonic energy at said wafer carrier and said wafers while said wafers are rotating:

providing a solution for performing a desired operation on said wafers disposed in said tank;

immersing said wafers in said solution while said wafers are being rotated, and simultaneously exposing said wafers to megasonic energy from said megasonic transducer, wherein said step of providing a solution comprises the steps of:

providing spray and fill nozzles disposed within said tank; and filling said tank with a cleaning solution using said spray and fill nozzles.

2. An method for processing semiconductor wafers, comprising the steps of:

providing a tank having sides attached to a bottom;

providing a wafer carrier loaded with semiconductor wafers for processing, said wafer carrier having supports for holding a plurality of wafers to be processed, said supports securely holding said semiconductor wafers at the edges of said wafers;

providing support means within said tank for holding said wafer carrier inside said tank so that said wafer carrier can rotate freely about an axis;

providing rotation means coupled to said wafer carrier for causing said wafer carrier to rotate about its axis within said tank while said wafers are securely held within said wafer carrier;

rotating said wafer carrier and said wafers within said tank while processing said wafers, thereby exposing all areas of said wafers equally during said processing;

providing a megasonic transducer with said tank;

directing megasonic energy at said wafer carrier and said wafers while said wafers are rotating:

providing a solution for performing a desired operation on said wafers disposed in said tank;

immersing said wafers in said solution while said wafers are being rotated, and simultaneously exposing said wafers to megasonic energy from said megasonic transducer, wherein said step of providing a solution comprises the steps of:

providing spray and fill nozzles disposed within said tank; and filling said tank with an etching solution using said spray and fill nozzles.

3. The method of claim 1, wherein said bottom of said tank is operable to travel upwards and downwards for providing a sealed condition and an open condition for said tank.

4. The method of claim 3, wherein said bottom is moved downwards away from said tank after said wafers are exposed to said megasonic energy for a predetermined time, thereby draining away said solution.

5. The method of claim 3, and further comprising the step of:

applying a rinsing agent on said rotating wafer carrier and said wafers from said nozzles after said bottom is moved away from said tank.

6. The method of claim 3, and further comprising the steps of:

moving said bottom upwards to seal said tank after the solution is drained away;

rotating the wafers;

spraying a rinsing agent from said nozzles onto said wafers until said tank is filled and said rotating wafers are immersed in the rinsing agent; and activating the megasonic transducer uniformly expose the rotating wafers to megasonic energy for a predetermined time.

7. The method of claim 3, and further comprising the steps of:

providing a top placed over said tank; and rotating said wafer carrier and said wafers while said bottom is moved away from said tank to perform a spin drying operation on said wafers, any liquids remaining on said wafers being transferred by the force of the rotation to said sides of the tank and to said top, the liquids then draining away from said wafers and out of the tank.

8. The method of claim 1, wherein said step of immersing said wafers in said solution while said wafers are being rotated, and simultaneously exposing said wafers to megasonic energy from said megasonic transducer comprises:

immersing said wafers in said solution;

rotating said wafer carrier and said wafers into a first desired position;

exposing said wafer carrier and said wafers to megasonic energy from said megasonic transducer for a predetermined time; and rotating said wafer carrier and said wafers into a next desired position to expose a different area of said wafers to the megasonic energy.

9. A method of processing at least one semiconductor wafer, comprising the steps of:

applying a solution to the at least one semiconductor wafer by spraying the at least one semiconductor wafer with the solution; and rotating the at least one semiconductor wafer, wherein said step of applying a solution includes immersing the at least one semiconductor wafer in said solution.

10. A method of processing at least one semiconductor wafer, comprising the steps of:

applying a solution to the at least one semiconductor wafer by spraying the at least one semiconductor wafer with the solution; and rotating the at least one semiconductor wafer, wherein said step of applying a solution includes spraying the at least one semiconductor wafer with said solution until said solution fills said tank.

11. A method of processing at least one semiconductor wafer, comprising the steps of:

exposing the at least one semiconductor wafer to megasonic energy; and rotating the at least one semiconductor wafer in a stepwise fashion to a new stationary position, then exposing a section of the semiconductor wafer to the megasonic energy, and then rotating the at least one semiconductor wafer to a new position, this process being repeated until all sections of the at least one semiconductor wafer have been exposed to megasonic energy for a predetermined time.

* * * * *